US011519983B2

(12) United States Patent
Arroyo Camejo et al.

(10) Patent No.: US 11,519,983 B2
(45) Date of Patent: Dec. 6, 2022

(54) QUANTUM SENSOR-BASED RECEIVING UNIT CONFIGURED FOR ACQUIRING MR SIGNALS

(71) Applicant: Siemens Healthcare GmbH, Erlangen (DE)

(72) Inventors: Silvia Bettina Arroyo Camejo, Fuerth (DE); Stefan Popescu, Erlangen (DE); Markus Vester, Nuremberg (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/363,556

(22) Filed: Jun. 30, 2021

(65) Prior Publication Data

US 2021/0405136 A1    Dec. 30, 2021

(30) Foreign Application Priority Data

Jun. 30, 2020  (DE) .......................... 102020208180.8

(51) Int. Cl.
*G01R 33/36* (2006.01)
*G01R 33/54* (2006.01)
*G01R 33/345* (2006.01)

(52) U.S. Cl.
CPC ....... *G01R 33/3621* (2013.01); *G01R 33/345* (2013.01); *G01R 33/543* (2013.01)

(58) Field of Classification Search
CPC .............. G01R 33/3621; G01R 33/345; G01R 33/543; G01R 33/0094; G01R 33/032; G01R 33/3692; G01R 33/26; G01R 33/445; G01R 33/323
See application file for complete search history.

(56) References Cited

U.S. PATENT DOCUMENTS

| | | | |
|---|---|---|---|
| 2013/0027041 A1* | 1/2013 | Savukov | G01R 33/26 324/322 |
| 2013/0082700 A1* | 4/2013 | Mizutani | G01R 33/26 324/301 |
| 2013/0082701 A1* | 4/2013 | Mizutani | G01R 33/323 324/301 |
| 2020/0064419 A1 | 2/2020 | Barry et al. | |

FOREIGN PATENT DOCUMENTS

DE    102016210259 A1    12/2017

OTHER PUBLICATIONS

Wolf, Thomas et. al., "Subpicotesla Diamond Magnetometry", Phys. Rev. X 5, 041001, 2015.
(Continued)

*Primary Examiner* — G. M. A Hyder
(74) *Attorney, Agent, or Firm* — Banner & Witcoff Ltd.

(57) ABSTRACT

The disclosure relates to a receiving unit configured for acquiring MR signals from an examination object in a magnetic resonance device. The receiving unit may include a detector unit comprising a light source and a first optical detector, a sensor unit comprising a first optical magnetometer, a first optical waveguide connecting the sensor unit to the light source, and a second optical waveguide connecting the sensor unit to the first optical detector.

24 Claims, 6 Drawing Sheets

(56) References Cited

OTHER PUBLICATIONS

Simonsen, Anders et al: "Magnetic resonance imaging with optical preamplification and detection"; Scientific reports; 2019; vol. 9; No. 1; pp. 1-7.

Budker, D. et. al., "Resonant nonlinear magneto-optical effects in atoms", Rev. Mod. Phys. 74, pp. 1153-1201, 2002.

De Lange, G. et. al., "Single-Spin Magnetometry with Multipulse Sensing Sequences", Phys. Rev. Lett. 106, 080802, 2011.

Lee, S. K. et. al., "Subfemtotesla radio-frequency atomic magnetometer for detection of nuclear quadrupole resonance", Applied Physics Letters 89, 214102, 2006.

Budker, D. et. al., "Optical magnetometry", Nature Physics, vol. 3, pp. 227-234, 2007.

Balasubramanian, G. et. al., "Ultralong spin coherence time in isotopically engineered diamond", Nature Materials 8, pp. 383-387, 2009.

Savukov, I; Karaulanov, T.: "Anatomical MRI with an atomic magnetometer"; in: Journal of Magnetic Resonance; No. 231, pp. 39-45.; 2013.

Steinert, S. et. al., "High sensitivity magnetic imaging using an array of spins in diamond", Rev. Sci. Instrum. 81, 043705, 2010.

Savukov, I. M. et. al., "Tunable Atomic Magnetometer for Detection of Radio-Frequency Magnetic Fields", Phys Rev Lett. 95(6), 063004, 2005.

Kominis, I. K. et. al., "A subfemtotesla multichannel atomic magnetometer", Nature, vol. 422, pp. 596-599, 2003.

Savukov, I. M. et. al., "NMR Detection with an Atomic Magnetometer", PRL 94, 123001, 2005.

Taylor, J. M. et. al., "High-sensitivity diamond magnetometer with nanoscale resolution", Nature Physics 4, pp. 810-816, 2008.

Xu, Shoujun et al: "Magnetic resonance imaging with an optical atomic magnetometer"; Proceedings of the National Academy of Sciences; 2006; vol. 103; No. 34; pp. 12668-12671.

Bending, S. J. et. al., "Local magnetic probes of superconductors", Adv. Phys. 48, pp. 449-535, 1999.

Rondin, L. et. al., "Nanoscale magnetic field mapping with a single spin scanning probe magnetometer", Appl. Phys. Lett., 100, 153118, 2012.

Arroyo Camejo, S., "Quantum Information, Quantum Sensing, and Super-Resolution Microscopy with Nitrogen-Vacancy Centers in Diamond", Dissertation, 2015.

German Action dated May 10, 2021, Application No. 10 2020 208 180.8.

* cited by examiner

QUANTUM SENSOR-BASED RECEIVING UNIT CONFIGURED FOR ACQUIRING MR SIGNALS

CROSS-REFERENCE TO RELATED APPLICATIONS

The present application claims the benefit of the filing date of Germany patent application no. DE 10 2020 208 180.8, filed on Jun. 30, 2020, the contents of which are incorporated herein by reference in their entirety.

TECHNICAL FIELD

The disclosure relates to a receiving unit configured to acquire magnetic resonance (MR) signals and a magnetic resonance system.

BACKGROUND

In a magnetic resonance device, the body to be examined of an examination object, in particular that of a patient, is typically exposed to a relatively strong main magnet field of, for example, 1.5 or 3 tesla, with the aid of a main magnet. In addition, gradient pulses are applied with the aid of a gradient coil unit. By means of a high frequency antenna unit, using suitable antenna devices, high frequency pulses, for example excitation pulses, are then emitted, which has the effect that the nuclear spins of particular atoms excited into resonance by these high frequency pulses are tilted by a defined flip angle relative to the magnetic field lines of the main magnet field. On relaxation of the nuclear spin, high frequency signals, so-called "magnetic resonance signals" (MR signals) are emitted and are received by suitable receiving units and then further processed. Conventional receiving units are configured as high frequency antennas and typically comprise copper coils. Copper coils, for example, with a diameter of 10 cm typically have a sensitivity of 0.01 fT/sqrt (Hz) for electromagnetic signals with a frequency of 64 MHz, which corresponds to the Larmor frequency of hydrogen protons at 1.5 T. Such copper coils typically have a sensitivity of 24 fT/sqrt (Hz) for electromagnetic signals with a frequency of 2 kHz, which corresponds to the Larmor frequency of hydrogen protons at 47 µT.

The frequency of the MR signals depends upon the strength of the main magnet field and on the spin generating the MR signals. The frequency of the MR signals substantially corresponds to the Larmor frequency of the spin at the relevant strength of the main magnet field. Typically, MR signals are acquired from the spins of the hydrogen protons ($^1$H). The signal-to-noise ratio of the MR signals is approximately linearly dependent upon the strength of the main magnet field. However, artifacts in the MR signals, for example, B1 inhomogeneities, also increase with the strength of the main magnet field.

SUMMARY

It is an object of the disclosure to provide a receiving unit (e.g. a receiver) for increasing the signal-to-noise ratio of MR signals and at lower strength values of the main magnet field. The object is achieved in accordance with e aspects described herein and with the features of the claims.

The receiving unit according to the disclosure configured for acquiring MR signals from an examination object in a magnetic resonance device comprises:

a detector unit comprising a light source and a first optical detector,
a sensor unit comprising a first optical magnetometer,
a first optical waveguide connecting the sensor unit to the light source, and
a second optical waveguide connecting the sensor unit to the first optical detector,
wherein spins comprised by the first optical magnetometer are configured to be aligned by initial light generated by the light source and to generate a first modified light, which first modified light is a measure for an MR signal occurring in a sensitivity range of the first optical magnetometer about the first position, and the first optical detector is configured to acquire the first modified light.

The examination object may be a person. The light source can be configured, for example, as a laser diode. The light source may be connected to the optical magnetometer via the first optical waveguide such that the photons generated in the light source reach the first optical magnetometer in the form of the initial light. The first optical waveguide may be coupled to the sensor unit, e.g. to the first optical magnetometer. The first magnetometer may comprise at least one optically active substance comprising spins, said spins being configured dependent upon the initial light and a magnetic field, e.g. an electromagnetic field, to modify the initial light that is to generate the first modified light. The MR signal may be an electromagnetic field emitted by the examination object, e.g. by the examination region, with a spatial resolution and is dependent upon the examination object, the examination region, and upon an MR control sequence that is used. MR signals are may be reconstructable into spatially resolved image data. Due to the spatial resolution of the MR signal, the first modified light is dependent upon the first position of the first optical magnetometer. The first modified light comprises a signature of the MR signal. The first optical magnetometer is typically configured to acquire MR signals within the sensitivity range of the first optical magnetometer. The sensitivity range can be defined by a maximum spacing from the first optical magnetometer, that is, by a maximum spacing from the first position. The maximum spacing is typically less than 25 cm, less than 15 cm, less than 12 cm, etc. The maximum spacing can be, e.g. less than 9 cm. The sensitivity range and the examination region preferably overlap at least partially. The first position typically has a spacing from the surface of the examination object of at least 1 cm, at least 3 cm, at least 5 cm, etc. The first position typically has a spacing from the surface of the examination object of not more than 8 cm, not more than 7 cm, not more than 6 cm, etc.

The second optical waveguide typically connects the sensor unit, e.g. the first optical magnetometer to the detector unit, e.g. to the first optical detector. The second optical waveguide may be configured to transmit the first modified light to the first optical detector. The detector unit may be configured to extract raw data from the first modified light.

Optical magnetometers have recently been developed that can be operated at room temperature, cf. e.g. D. Budker et al.: Resonant nonlinear magneto-optical effects in atoms. Rev. Mod. Phys. 74, 1153-1201 (2002), or J. M. Taylor et al.: High-sensitivity diamond magnetometer with nanoscale resolution, Nature Physics 4 (2008).

Optical magnetometers are distinguished by having a high level of sensitivity for particular signal frequencies. The sensitivity is significantly increased in comparison with copper coils as used in conventional receiving units. This increases the signal-to-noise ratio in the acquired MR signals and thus in the image data to be reconstructed therefrom. Previously, the signal-to-noise ratio in MR imaging has primarily been achieved by means of a greater strength of the main magnet field, which is particularly complex and costly. The receiving unit according to the disclosure enables a more economical and particularly efficient possibility for increasing the signal-to-noise ratio and therefore the quality in the MR imaging. It is also conceivable explicitly to use magnetic resonance devices with a lower main magnet field strength with a signal-to-noise ratio, which remains the same due to the use of the receiving unit according to the disclosure. This is, firstly, a cost saving since the costs of the main magnet increase with the strength of the main magnet field. Secondly, due to a lower strength of the main magnet field, artifacts such as, for example, B1 inhomogeneities can be reduced.

One embodiment of the receiving unit provides that the detector unit has a spacing of at least 0.3 meters from the sensor unit.

The spacing between the detector unit and the sensor unit may be at least 0.3 meters, at least 1.0 meter, at least 2.0 meters, etc. The length of the first optical waveguide and/or of the second optical waveguide may be at least 0.3 meters, at least 1.0 meter, at least 2.0 meters, etc.

The sensor unit and/or the first optical waveguide and/or the second optical waveguide may be a purely optical component. The detector unit is typically connected to a current source and/or comprises electronic components. In the context of an MR examination, the sensor unit is typically positioned in the immediate vicinity of the examination object, e.g. within the recording region of the magnetic resonance device and is thus exposed to the main magnet field. This embodiment enables the detector unit, e.g. all the electronic components comprised by the receiving unit, to be positioned outside the magnetic resonance device. For example, the detector unit and/or all the electronic components comprised by the receiving unit can be arranged outside a region around the magnetic resonance device, within which region a static magnetic field of at least 0.5 mT, e.g. at least 0.001 mT, is present.

An optical sensor unit, which may be free from electronic components, typically has no influence on MR signals and/or other electromagnetic fields and/or magnetic fields used in the context of MR imaging. This applies similarly for optical waveguides. By this means, the MR signals are free from modulation caused by external components. This increases the quality of the MR signals and thus the quality of the image data to be reconstructed. In particular, artifacts can be reduced. Similarly, electromagnetic signals, for example, in the form of MR signals and/or high frequency pulses and/or gradient pulses cannot influence the functioning of the sensor unit for lack of interaction with the sensor unit. The sensor unit is consequently particularly robust.

One embodiment of the receiving unit provides that the sensor unit and/or the optical magnetometer is free from a macroscopic quantity of metal and/or free from copper. A macroscopic quantity of metal is typically characterized by being visually perceptible. A macroscopic quantity of metal may be characterized e.g. by an electrical conductivity which, when magnetic field gradients are generated by switching gradient pulses, can induce eddy currents. If the sensor unit and/or the optical magnetometer is free from a macroscopic quantity of metal, the sensor unit typically has no influence on MR signals and/or other electromagnetic fields and/or magnetic fields used in the context of MR imaging. A sensor unit free from copper is particularly advantageous, since copper has a particularly high conductivity and therefore a particularly large interaction between the receiving unit and the MR signals can be prevented.

One embodiment of the receiving unit provides that the sensor unit comprises at least three further optical magnetometers, the three further optical magnetometers and the first optical magnetometer being arranged at four mutually different positions, each of the three further optical magnetometers comprising spins which are configured to generate, from the initial light generated by the light source, a further modified light, said further modified light being a measure for an MR signal occurring in a sensitivity range of each further optical magnetometer about the respective position.

The receiving unit may comprise a plurality, typically at least four, 16, 32, etc. of optical magnetometers configured for the acquisition of MR signals. The at least four optical magnetometers, that is, the first optical magnetometer and the at least three further optical magnetometers, are typically arranged at four mutually different positions, wherein each of the at least four optical magnetometers is configured to convert MR signals in the sensitivity range about the respective position into respectively modified light.

The at least four optical magnetometers may be arranged such that the respective sensitivity ranges at least partially overlap. The spacing between two respectively adjacent positions of the four mutually different positions may be less than twice the maximum spacing defining the sensitivity range of the respective optical magnetometer. The spacing between two respectively adjacent positions of the four mutually different positions may be between 3 cm and 30 cm, between 5 cm and 25 cm, between 10 cm and 20 cm, etc.

Each of the at least four optical magnetometers is typically linked by the first optical waveguide to the light source. For this purpose, the first optical waveguide can comprise at least four first individual optical waveguides, in each case, one of the at least four first individual optical waveguides at least partially creates an optical connection between an optical magnetometer and the light source.

The functional principle of the at least three further optical magnetometers corresponds to the functional principle of the first optical magnetometer. The at least four optical magnetometers can, however, be of different design For example, the first optical magnetometer can be configured as an atomic vapor cell magnetometer and at least one of the three further optical magnetometers can be configured as a diamond having a nitrogen-vacancy center.

The use of a plurality of optical magnetometers increases the sensitivity range of the entire receiving unit. In particular, it enables a greater spatial coverage of the examination region and a greater spatial resolution of the MR signals thus acquired. The use of a plurality of optical magnetometers enables an acceleration of the MR imaging, for example, by means of the use of parallel imaging, which operates on the basis of the acquisition of MR signals by differently positioned sensors. By this means, the receiving unit can be utilized well in the clinical routine, in particular. In addition, the noise is reduced and the signal-to-noise ratio is improved.

One embodiment of the receiving unit provides that the second optical waveguide comprises at least four second individual optical waveguides, and each of the at least four optical magnetometers is separately connected by means of a respective second individual optical waveguide to the detector unit. The detector unit is connected, according to this embodiment, to each of the at least four optical magnetometers via a separate optical waveguide. The at least four modified lights can then be transferred separately to the detector unit. By this means, the at least four modified lights are associated particularly well with the individual optical magnetometers and/or their respective positions. Thus, an interaction of the at least four modified lights can be prevented particularly well.

The at least four second individual optical waveguides can be connected to the first optical detector, which is configured to process the at least four modified lights. The detector unit can also comprise at least three further optical detectors, in which the detector unit as a whole comprises at least four optical detectors. Each of the at least four optical detectors can be connected via a second individual optical waveguide to one of the at least four optical magnetometers. By this means, the at least four modified lights can be processed particularly efficiently and precisely.

One embodiment of the receiving unit provides that the first optical waveguide comprises at least one optical splitter device. The optical splitter device may comprise at least one beam splitter. The optical splitter device may be configured to subdivide the first optical waveguide into at least four first individual optical waveguides. For this purpose, the optical splitter device can comprise a plurality of individual beam splitters, each of which subdivides an optical waveguide into two optical waveguides. The optical splitter device may be configured as a passive component and/or may function in an inverted mode as a combining device. Such a splitter device enables the use of a plurality of optical magnetometers with only one light source.

One embodiment of the receiving unit provides that the at least four optical magnetometers are flexibly connected to one another. The at least four optical magnetometers are typically connected to one another at least pair-wise by means of respectively at least one first optical waveguide and/or one second optical waveguide. Each of the at least four optical magnetometers may be connected to at least two of the at least four optical magnetometers. The at least four optical magnetometers may be surrounded by a flexible sleeve. The flexible connection of the at least four optical magnetometers enables an individual adaptation of the sensor unit to a surface of the examination object. Thereby, a smaller spacing between the at least four optical magnetometers and the surface of the examination object, for example, less than 5 cm, less than 3 cm, etc. can be ensured. Thereby, the respective sensitivity ranges of the at least four optical magnetometers can be utilized particularly efficiently by means of particularly large overlapping of the sensitivity ranges with the examination region. This additionally increases the signal-to-noise ratio.

One embodiment of the receiving unit provides that the first optical magnetometer is configured as an atomic vapor cell magnetometer. If the receiving unit comprises a plurality of optical magnetometers, then a portion and/or all of the plurality of optical magnetometers may be configured as atomic vapor cell magnetometers.

Atomic vapor cell magnetometers, also known as "atomic vapor cells" can be operated purely optically. Atomic vapor cell magnetometers enable a detection of the MR signal on the basis of magneto-optical rotation of the initial light. The first detector may be configured to acquire the first modified light polarimetrically. The second optical waveguide may comprise a polarization filter which is arranged between the first optical magnetometer and the first optical detector.

The atomic vapor cell magnetometer may comprise at least one alkali metal, such as rubidium and/or cesium. The alkali metal may be present atomically and comprise the spins, which are aligned by the initial light and generate a first modified light which is representative of an MR signal. The atomic vapor cell magnetometer may comprise a glass body surrounding the at least one alkali metal.

The functional principle of an atomic vapor magnetometer is described, for example by D. Budker et al.: Resonant nonlinear magneto-optical effects in atoms, Rev. Mod. Phys. 74, 1153-1201 (2002) and/or by I. M. Savukov, S. J. Seltzer, M. V. Romalis, and K. L. Sauer: Tunable atomic magnetometer for detection of radio-frequency magnetic fields, Phys. Rev. Lett. 95, 6:063004 (2005) and/or by D. Budker, M. Romalis: Optical magnetometry, Nature Physics 3 (2007). An atomic vapor cell magnetometer of this type can be operated at room temperature and/or free from coolant.

Atomic vapor cell magnetometers are commercially available and/or have a particularly high sensitivity for MR signals at a frequency in the range of 0.4 MHz to 0.5 MHz (cf. S.-K. Lee, K. L. Sauer, S. J. Seltzer, O. Alem, M. V. Romalis: Subfemtotesla radio-frequency atomic magnetometer for detection of nuclear quadrupole resonance, Appl. Phys. Lett. 89, 214106 (2006)). This reduces the noise particularly well and enables a high quality in the image data to be reconstructed.

The atomic vapor cell magnetometer can be configured as a spin exchange relaxation-free (SERF) magnetometer. A SERF magnetometer can have a sensitivity of less than 1 fT/sqrt (Hz) for electromagnetic signals having frequencies in the range from 10 Hz to 5 MHz (I. K. Kominis, T. W. Kornack, J. C. Allred, M. V. Romalis: A subfemtotesla multichannel atomic magnetometer, Nature. 422, 6932, 596-599 (2003)). Consequently, SERF magnetometers can detect MR signals emanating from hydrogen protons ($^1$H) even in magnetic resonance devices with a main magnet field strength of less than 0.025 T.

Consequently, atomic vapor cell magnetometers enable a particularly high signal-to-noise ratio which allows a clinical use of magnetic resonance devices with a main magnet field strength of less than 0.5 T.

One embodiment of the receiving unit provides that the first optical waveguide comprises at least two partial waveguides, a first of the at least two partial waveguides being configured to transfer light for optical pumping to the atomic vapor cell magnetometer, and a second of the at least two partial waveguides is configured to transfer polarized light to the atomic vapor cell magnetometer.

For the functional principle of an atomic vapor cell magnetometer, a population inversion of the spin, in particular, of the alkali metal atoms is required. This population inversion can be generated by means of optical pumping. In addition, for the functional principle of an atomic vapor cell magnetometer, an irradiation of polarized light is required, which is modified through the spin, dependent upon the MR signal. Consequently, the initial light according to this embodiment comprises light for optical pumping and polarized light. The light for optical pumping and the polarized light may be generated as the initial light by the light source. The first optical waveguide may comprise a beam splitter which divides the first optical waveguide conducting the first light into the at least two partial waveguides. The at least two partial waveguides may be arranged at least partially parallel. This embodiment comprising two partial waveguides is economically implementable since only one light source is required.

If the sensor unit comprises a plurality of optical magnetometers, e.g. N optical magnetometers, then the receiving unit may comprise a splitter device and subdivide the first optical waveguide into two times N partial waveguides, wherein two of the partial waveguides are connected, in each case, to one optical magnetometer.

One embodiment of the receiving unit provides that the first optical magnetometer comprises a crystal having a vacancy center. If the receiving unit comprises a plurality of optical magnetometers, then a portion and/or all of the plurality of optical magnetometers may be configured as crystals having a vacancy center.

Crystals having a vacancy center can be used as optical magnetometers. This has previously been described by, for example, J. M. Taylor et al.: High-sensitivity diamond magnetometer with nanoscale resolution, Nature Physics 4 (2008), and/or S. Steinert et al.: High sensitivity magnetic imaging using an array of spins in diamond, Rev. Sci. Instrum. 81 (2010) and/or S. Arroyo: Quantum information, quantum sensing, and super-resolution microscopy with nitrogen-vacancy centers in diamond, dissertation, Heidelberg (2015), and/or L. Rondin et al.: Nanoscale magnetic field mapping with a single spin scanning probe magnetometer, Appl. Phys. Lett., 100, 153118 (2012).

Crystals having a vacancy center can be formed with DC and/or AC magnetic fields for acquiring electromagnetic fields. DC magnetometry can be realized by tracking optically-detectable MR line positions and/or by the application of a Ramsey sequence. AC magnetometry can be realized through a selection of different pulse sequences, for example, CPMG in order to acquire electromagnetic fields, that is MR signals, with a sensitivity of less than pT/sqrt (Hz) (T. Wolf et al.: Subpicotesla Diamond Magnetometry, Phys. Rev. X 5, 041001 (2015); G. de Lange, D. Riste, V. V. Dobrovitski and R. Hanson: Single-Spin Magnetometry with Multipulse Sensing Sequences, Phys. Rev. Lett. 106, 080802 (2011)).

Crystals having a vacancy center are configured to acquire MR signals purely optically. Crystals having a vacancy center use the effect of the fluorescence that is characteristic for the vacancy center. The crystal having a vacancy center changes the color of the initial light, the intensity of the fluorescence being dependent upon the MR signal at the position of the optical magnetometer. The first modified light typically comprises fluorescence.

Crystals in the form of a diamond having a nitrogen-vacancy center (NV center) as the vacancy center may be suitable. The light source may be configured to generate coherent light. The light source may be configured as a laser diode. The light source may be configured to generate an initial light with a wavelength of between 450 nm and 650 nm, between 520 nm and 540 nm, between 525 nm and 535 nm, that is, green light, etc. The initial light may be green light. The first modified light may be red light. Diamonds of this type having NV centers are configured to acquire electromagnetic fields with a frequency of 20 kHz, that is, MR signals at 20 kHz with a sensitivity of less than pT/sqrt (Hz).

Crystals having a vacancy center have a particularly high sensitivity for the detection of electromagnetic fields and thus enable a detection of MR signals with particularly low noise. These are superior to conventional receiving units comprising copper coils with regard to sensitivity.

One embodiment of the receiving unit additionally comprises a frequency filter which is arranged between the first optical magnetometer and the first optical detector. The frequency filter may be configured as an interference filter and/or as a dichroic mirror. This enables a separation of the first modified light from the initial light. This corresponds to a filtration of the portion of the first modified light characterizing the MR signal, which is typically evaluated by the first detector. This reduces the noise and thus improves the quality of the raw data that can be extracted from the first modified light, e.g. from the filtered first modified light.

One embodiment of the receiving unit additionally comprises an antenna unit for generating an electromagnetic wave, e.g. a microwave, and a waveguide connected to the antenna unit and at least partially surrounding the first optical magnetometer. For the manipulation of the spin of the vacancy centers for the purpose of magnetometry, an excitation by means of an electromagnetic wave may be utilized. The waveguide is configured to conduct an electromagnetic wave generated in the antenna unit to the first optical magnetometer. The antenna unit can be spaced apart from the first optical magnetometer. The antenna unit may have a spacing of at least 0.3 meters, at least 1.0 meter, at least 2.0 meters from the first optical magnetometer, etc., which spacing can be connected by the waveguide. The waveguide typically connects the first optical magnetometer to the antenna unit.

This embodiment thus enables a generation of an electromagnetic wave required for the operation of the first optical magnetometer at a spacing from the first optical magnetometer. Since the antenna unit typically comprises electronic components and/or macroscopic metal, this may be advantageous since an influencing of the MR imaging by the antenna unit can be prevented.

One embodiment of the receiving unit provides that the antenna unit is configured as part of the detector unit. The detector unit may be arranged at a spatial distance from the sensor unit. The detector unit may be arranged outside an HF-screened (e.g. radio-frequency (RF)-screened) region surrounding the sensor unit. A receiving unit of this type is constructed particularly compact and easily usable. It is nevertheless advantageous if the antenna unit, typically comprising electronic components, is arranged at a spatial distance from the sensor unit.

One embodiment of the receiving unit provides that the waveguide comprises a dielectric waveguide and a dielectric resonator.

The dielectric resonator surrounds the optical magnetometer, e.g. the crystal having a vacancy center at least partially. The dielectric resonator may at least partially comprise ceramic material. The dielectric waveguide can be configured as a coaxial cable. This embodiment enables a receiving unit which is free from macroscopic metal outside the detector unit.

One embodiment of the receiving unit provides that the second optical waveguide and the waveguide are formed as a common waveguide. The whole waveguide may be configured to conduct an electromagnetic wave generated in the antenna unit to the first optical magnetometer and to transfer the first modified light to the detector unit. The first modified light can be measured indirectly via a quality factor. The principles of the method are described, for example, in US20200064419 A1. This embodiment enables dispensing with a separate waveguide configured for conducting an electromagnetic wave generated in the antenna unit to the first optical magnetometer or for transferring the first modified light to the detector unit. By means of the common waveguide, the second optical waveguide or the waveguide can be dispensed with.

One embodiment of the receiving unit provides that the dielectric waveguide and the dielectric resonator are coupled across a gap. This embodiment enables a particularly good and even transmission of the electromagnetic wave to the crystal having a vacancy center.

One embodiment of the receiving unit provides that the waveguide is arranged at least partially parallel to the first optical waveguide. For instance, if the sensor unit comprises a plurality of optical magnetometers with crystals having a vacancy center, an at least partially parallel guidance of the waveguide and of the first individual optical waveguide is advantageous to arrange the waveguides.

One embodiment of the receiving unit provides that the receiving unit is configured for acquiring MR signals generated by magnetic resonance devices having a main magnet field strength of not more than 0.5 tesla, not more than 0.1 tesla, not more than 0.025 tesla, etc. The receiving unit can also be configured for acquiring MR signals generated by magnetic resonance devices having a main magnet field strength of not more than 0.01 tesla, not more than 0.005 tesla, etc. In particular, in the embodiment according to which the first optical magnetometer is configured as an atomic vapor cell magnetometer, the receiving unit is configured for acquiring MR signals generated by magnetic resonance devices having a main magnet field strength of not more than 0.05 tesla, not more than 0.01 tesla, not more than 0.025 tesla, etc. In the embodiment according to which the first optical magnetometer is configured as a crystal having a vacancy center, the receiving unit may be configured for acquiring MR signals generated by magnetic resonance devices having a main magnet field strength of not more than 1.5 tesla, not more than 1.0 tesla, not more than 0.5 tesla, etc. If the first optical magnetometer is configured as a crystal having a vacancy center, the receiving unit can be configured for acquiring MR signals generated by magnetic resonance devices having a main magnet field strength of not more than 0.1 tesla, not more than 0.01 tesla, not more than 0.002 tesla, etc.

If the first optical magnetometer is configured as a crystal having a vacancy center, the receiving unit can be configured for acquiring MR signals generated by magnetic resonance devices having a main magnet field strength of between 0.001 tesla and 0.5 tesla, between 0.005 tesla and 0.1 tesla, between 0.01 tesla and 0.05 tesla, etc.

Optical magnetometers have a particularly high sensitivity to the acquired electromagnetic fields with frequencies of less than 1 MHz. This increases the signal-to-noise ratio in the acquired MR signals, particularly in comparison with conventional receiving units comprising copper coils, and thus in the image data to be reconstructed therefrom. MR signals with such a low main magnet field strength can be recorded without repetitions of the MR control sequence, that is, particularly rapidly. The use of the receiving unit according to the disclosure in combination with magnetic resonance devices having a main magnet field strength of not more than 0.05 tesla, not more than 0.025 tesla, not more than 0.01 tesla, etc. is advantageous for interventional procedures. Such low main magnet field strengths enable a simpler use, in particular with mainly metallic devices required for interventional procedures.

Additionally, the disclosure relates to a magnetic resonance system comprising a magnetic resonance device arranged in an HF-screened room (e.g. an RF-screened room), a control unit arranged outside the HF-screened room and a receiving unit according to the disclosure, wherein the sensor unit is arranged within the HF-screened room and the detector unit is arranged outside the HF-screened room. An embodiment of the magnetic resonance system provides that the magnetic resonance device comprises a main magnet for generating a static main magnet field with a strength of not more than 0.05 tesla. Embodiments of the magnetic resonance system according to the disclosure are configured similarly to the embodiments of the receiving unit according to the disclosure.

The advantages of the magnetic resonance system according to the disclosure substantially correspond to the advantages of the receiving unit according to the disclosure, already described in detail above. Features, advantages, or alternative embodiments mentioned herein can also be transferred to the other classes of claimed subject matter, and vice versa.

BRIEF DESCRIPTION OF THE DRAWINGS/FIGURES

Further advantages, characteristics and details of the present disclosure will become apparent from the ensuing description of exemplary embodiments and from the drawings.

In the drawings.

DETAILED DESCRIPTION

Figure 1:
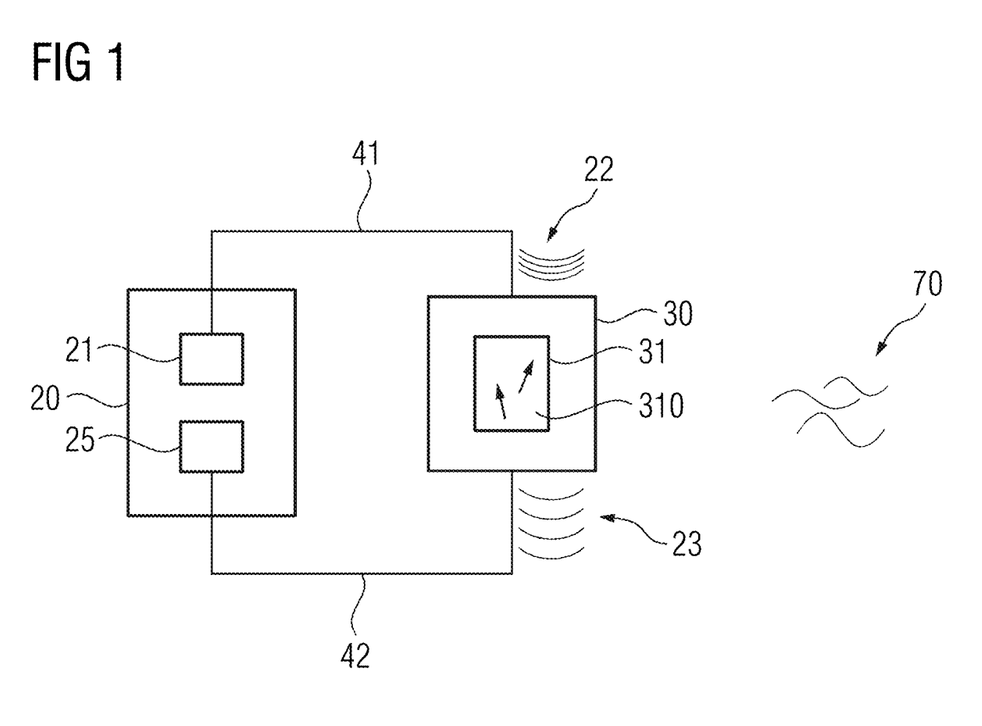
FIG. 1 illustrates a schematic representation of a first embodiment of a receiving unit according to the disclosure.

FIG. 1 shows a schematic representation of a first embodiment of a receiving unit according to the disclosure. The receiving unit may alternatively be referred to herein as a receiver or receiving circuitry, and comprises a detector unit 20 (referred to herein alternatively as a detector or detector circuitry) comprising a light source 21 and a first optical detector 25. The receiving unit comprises a sensor unit 30 (referred to herein alternatively as a sensor or detector sensor) comprising a first optical magnetometer 31. The receiving unit additionally comprises a first optical waveguide 41 connecting the sensor unit 30 to the light source 21 and a second optical waveguide 42 connecting the sensor unit 30 to the first optical detector 25. The first optical magnetometer 31 comprises spins 310 which are configured to be aligned in the presence of initial light 22 generated by the light source and to generate a first modified light 23, said first modified light 23 being a measure for an MR signal 70 occurring in the sensitivity range 61 about the first position 51 of the first optical magnetometer. The first optical detector 25 is configured to acquire the first modified light 23. The MR signal 70 occurring may be generated by a magnetic resonance device with a main magnet field strength of not more than 0.05 tesla. The spacing of the detector unit 20 from the sensor unit 30 may be at least 0.3 meters.

Figure 2:
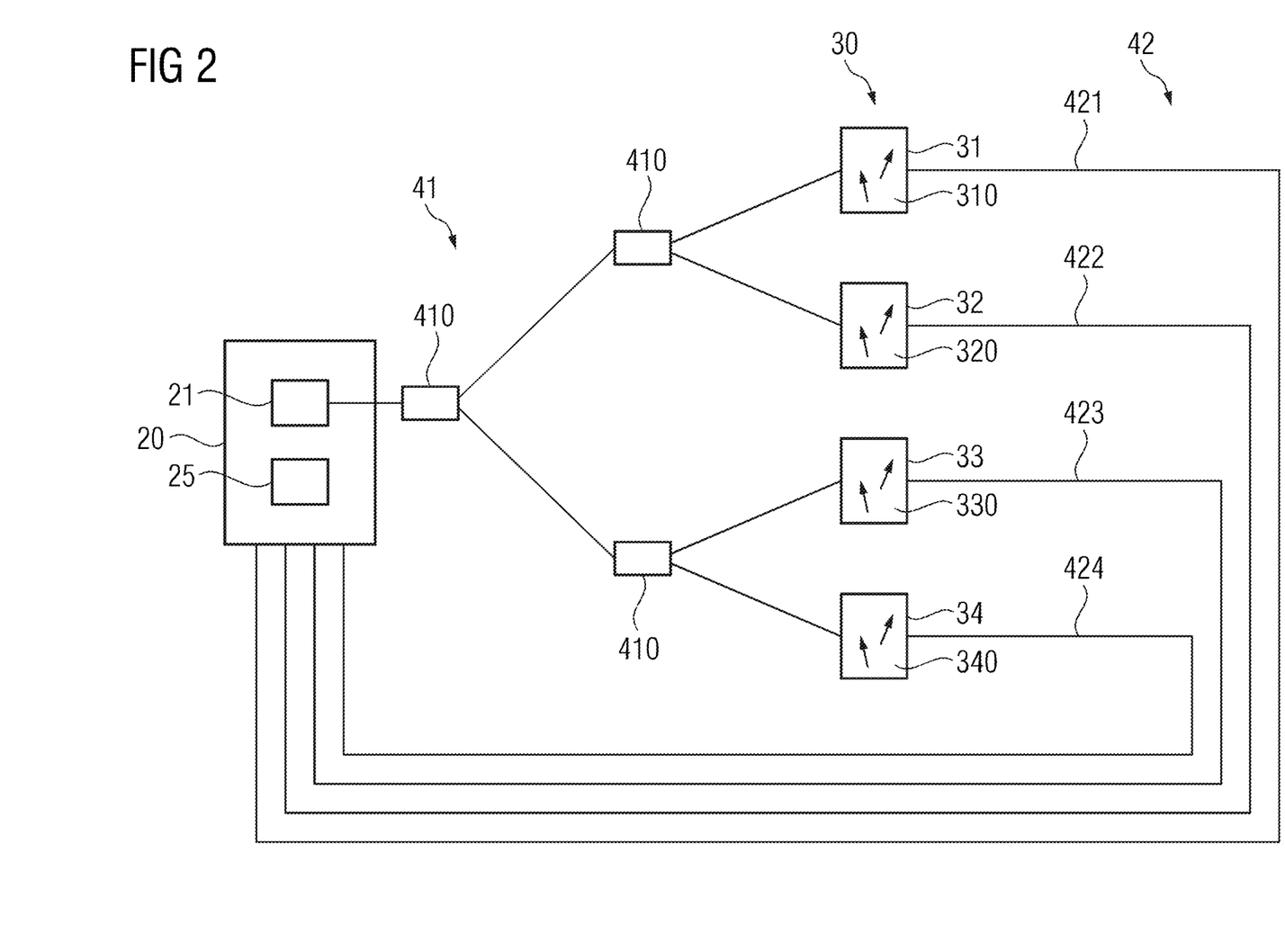
FIG. 2 illustrates a schematic representation of a second embodiment of a receiving unit according to the disclosure comprising a plurality of optical magnetometers.

FIG. 2 shows a schematic representation of a second embodiment of a receiving unit according to the disclosure comprising a plurality of optical magnetometers. According to this embodiment, the sensor unit 30 comprises three further optical magnetometers 32, 33, 34. The three further optical magnetometers and the first optical magnetometer are arranged at four mutually different positions, and each of the three further optical magnetometers comprises spins 320, 330, 340, respectively, said spins 320, 330, 340 being configured to be aligned in the presence of initial light 22 generated by the light source 21 and each to generate a further modified light, said further modified light being a measure for an MR signal occurring in a sensitivity range of the position of each optical magnetometer 32, 33, 34.

The second optical waveguide 42 comprises four second individual optical waveguides 421, 422, 423, 424, and each of the four optical magnetometers 31, 32, 33, 34 is separately connected by means of a second individual optical waveguide 421, 422, 423, 424 to the detector unit 20 and/or the first detector 25. The supply of the four optical magnetometers 31, 32, 33, 34 by the one light source 20 on the basis of the first optical waveguide 41 is ensured in that the first optical waveguide 41 comprises three optical splitter devices 410.

Figure 3:
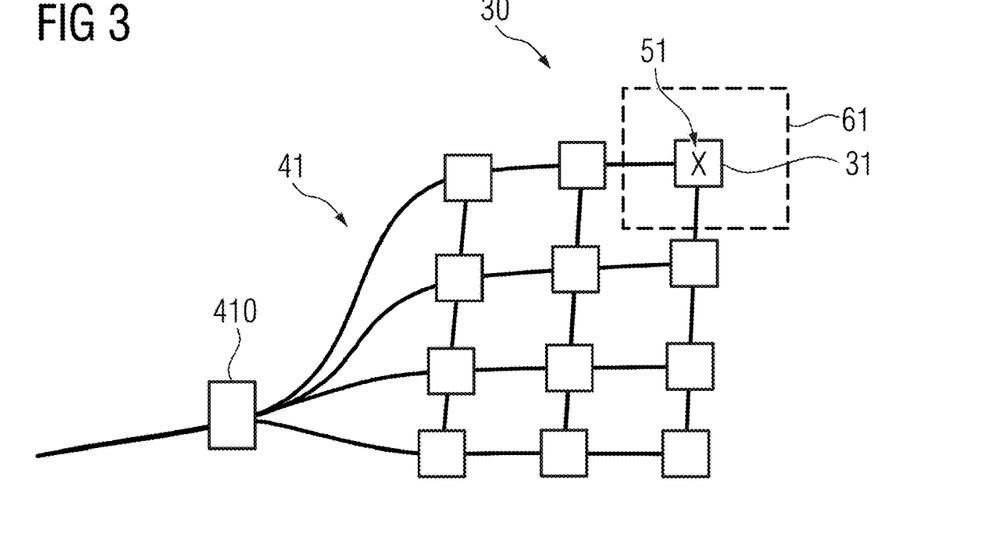
FIG. 3 illustrates a schematic representation of a third embodiment of a receiving unit according to the disclosure comprising a plurality of optical magnetometers.

FIG. 3 shows a schematic representation of a third embodiment of a receiving unit according to the disclosure comprising a plurality of optical magnetometers. The sensor unit 30 comprises a plurality of optical magnetometers 31 which are arranged at mutually different positions 51. The optical magnetometers 31 are thus spatially distributed. According to this embodiment, the optical magnetometers 31 are arranged approximately matrix-like. The optical magnetometers 31 may be flexibly connected to one another, for example, via the first optical waveguide 41 and/or the second optical waveguide 42. The sensor unit 30 may be configured to be arranged and/or positioned on a surface of an examination object. The first optical magnetometer 31 may be configured to acquire an MR signal 70 occurring in the sensitivity range 61 about the first position 51. The spatial distribution of the plurality of optical magnetometers 31 corresponding to their positions enables a spatially-resolved acquisition of the MR signal 70. The splitter device 410 is configured such that the first optical waveguide 41 is subdivided into at least N first individual optical waveguides, N being the number of optical magnetometers 31 of the sensor unit 30. Each of the N first individual optical waveguides is then connected to an optical magnetometer 31 of the sensor unit 30.

Figure 4:
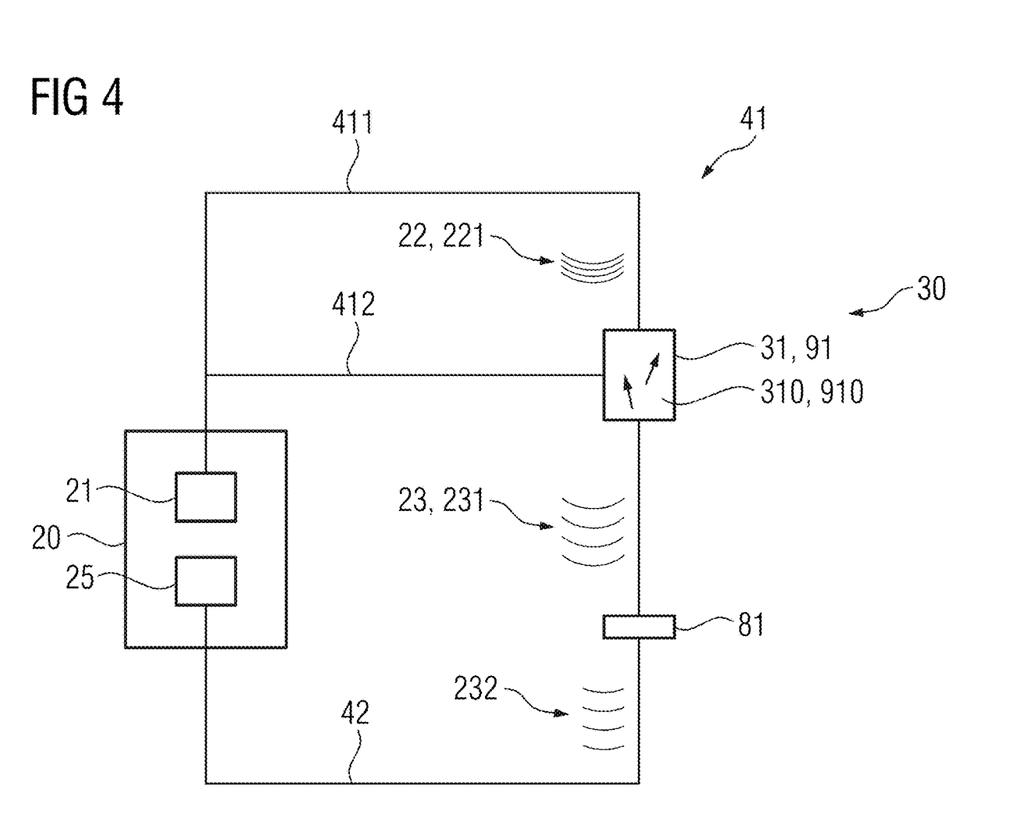
FIG. 4 illustrates a schematic representation of a fourth embodiment of a receiving unit according to the disclosure comprising an atomic vapor cell magnetometer.

FIG. 4 shows a schematic representation of a fourth embodiment of a receiving unit according to the disclosure comprising an atomic vapor cell magnetometer, the first optical magnetometer 31 being configured as an atomic vapor cell magnetometer 91. The spins 910 comprised by the first optical magnetometer 31, that is, by the atomic vapor cell magnetometer 91, are typically a component of individual alkali metal atoms. The atomic vapor cell magnetometer 91, e.g. the sensor unit 30, is free from a macroscopic quantity of metal and free from copper. According to this embodiment, the first optical waveguide 41 comprises two partial waveguides 411, 412. The first partial waveguide 412 of the at least two partial waveguides 411, 412 is configured to transmit light for optical pumping to the atomic vapor cell magnetometer 91, and the second partial waveguide 411 of the at least two partial waveguides 411, 412 is configured to transfer polarized light 221 to the atomic vapor cell magnetometer 91. The polarized light can correspond to the initial light 22. The receiving unit typically comprises a polarization filter 81 by means of which the first modified light 23, 231 is polarized to polarized first modified light 232. The connection between the first partial waveguide 412 and the atomic vapor cell magnetometer 91 may takes place by means of a glass fiber coupling. The connection between the second partial waveguide 411 and the atomic vapor cell magnetometer 91 may take place by means of a glass fiber coupling.

Figure 5:
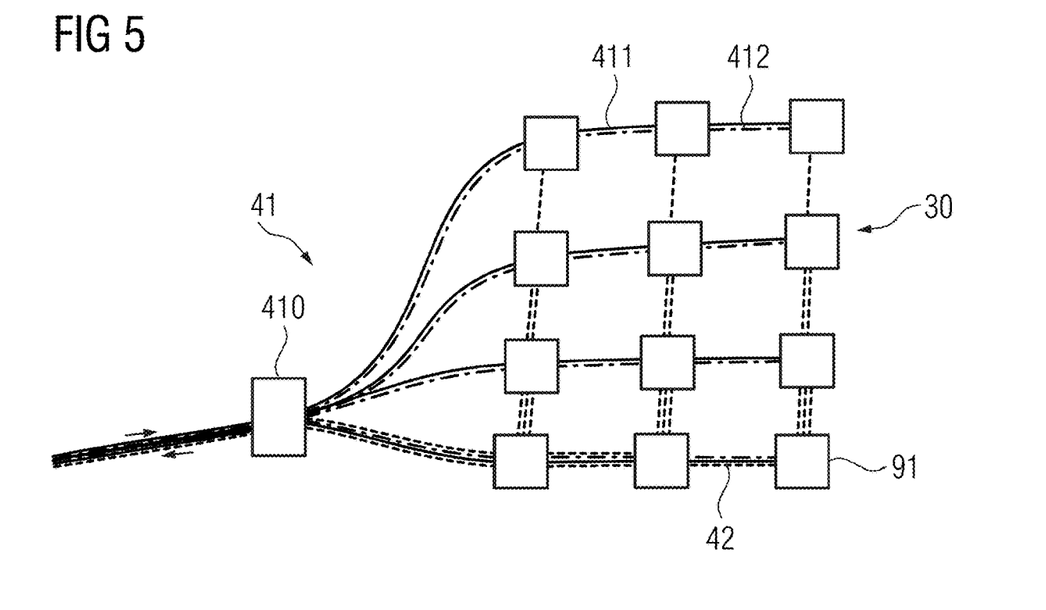
FIG. 5 illustrates a schematic representation of a fifth embodiment of a receiving unit according to the disclosure comprising a plurality of atomic vapor cell magnetometers.

FIG. 5 shows a schematic representation of a fifth embodiment of a receiving unit according to the disclosure comprising a plurality of atomic vapor cell magnetometers, the sensor unit 30 comprising N atomic vapor cell magnetometers 91. The splitter device 410 is configured such that the first optical waveguide 41 is subdivided into at least N first individual optical waveguides and each of the at least N first individual optical waveguides is subdivided into two partial waveguides 411, 412. The 2 N partial waveguides 411, 412 are connected in pairs, each to an atomic vapor cell magnetometer 91.

Figure 6:
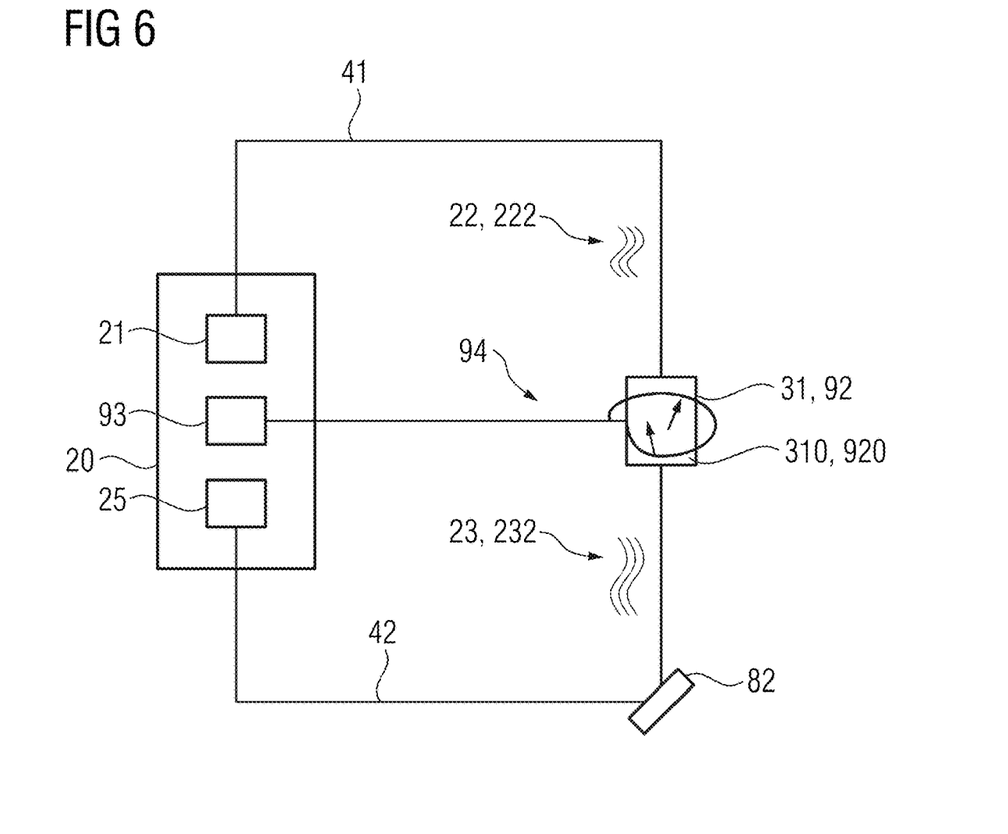
FIG. 6 illustrates a schematic representation of a sixth embodiment of a receiving unit according to the disclosure comprising a crystal having a vacancy center.

FIG. 6 shows a schematic representation of a sixth embodiment of a receiving unit according to the disclosure, the first optical magnetometer 31 being configured as a crystal having a vacancy center 92. The crystal having a vacancy center 92 comprises spins 920. The receiving unit, e.g. the sensor unit 30, comprises a frequency filter 82 configured as a dichroic mirror which is arranged between the crystal having a vacancy center 92 and the first optical detector 25. The receiving unit, e.g. the detector unit 20, additionally comprises an antenna unit 93 according to this embodiment, which is configured for generating an electromagnetic wave, such as a microwave. The receiving unit additionally has a waveguide 94, which is connected to the antenna unit 93 and the crystal having a vacancy center 92 and/or at least partially surrounds the crystal having a vacancy center 92. The waveguide 94 can be arranged parallel to the first optical waveguide 41. The initial light 22 typically comprises coherent light 222. The first modified light 23 typically comprises fluorescence light 232.

Figure 7:
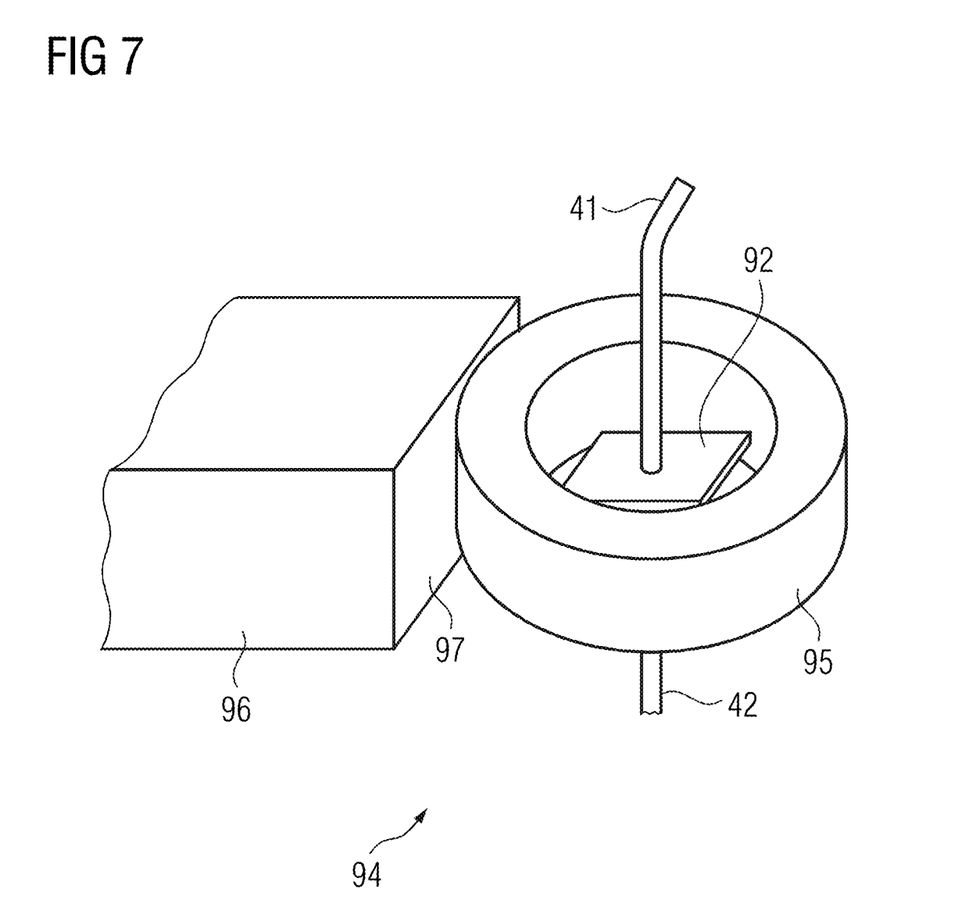
FIG. 7 illustrates a schematic representation of an embodiment of a connection of the waveguide with the crystal having a vacancy center.

FIG. 7 shows a schematic representation of an embodiment of a connection of the waveguide 94 to the crystal having a vacancy center 92. According to this embodiment, the waveguide 94 comprises a dielectric waveguide 96 and a dielectric resonator 95, the dielectric waveguide 96 and the dielectric resonator 95 being coupled across a gap.

Figure 8:
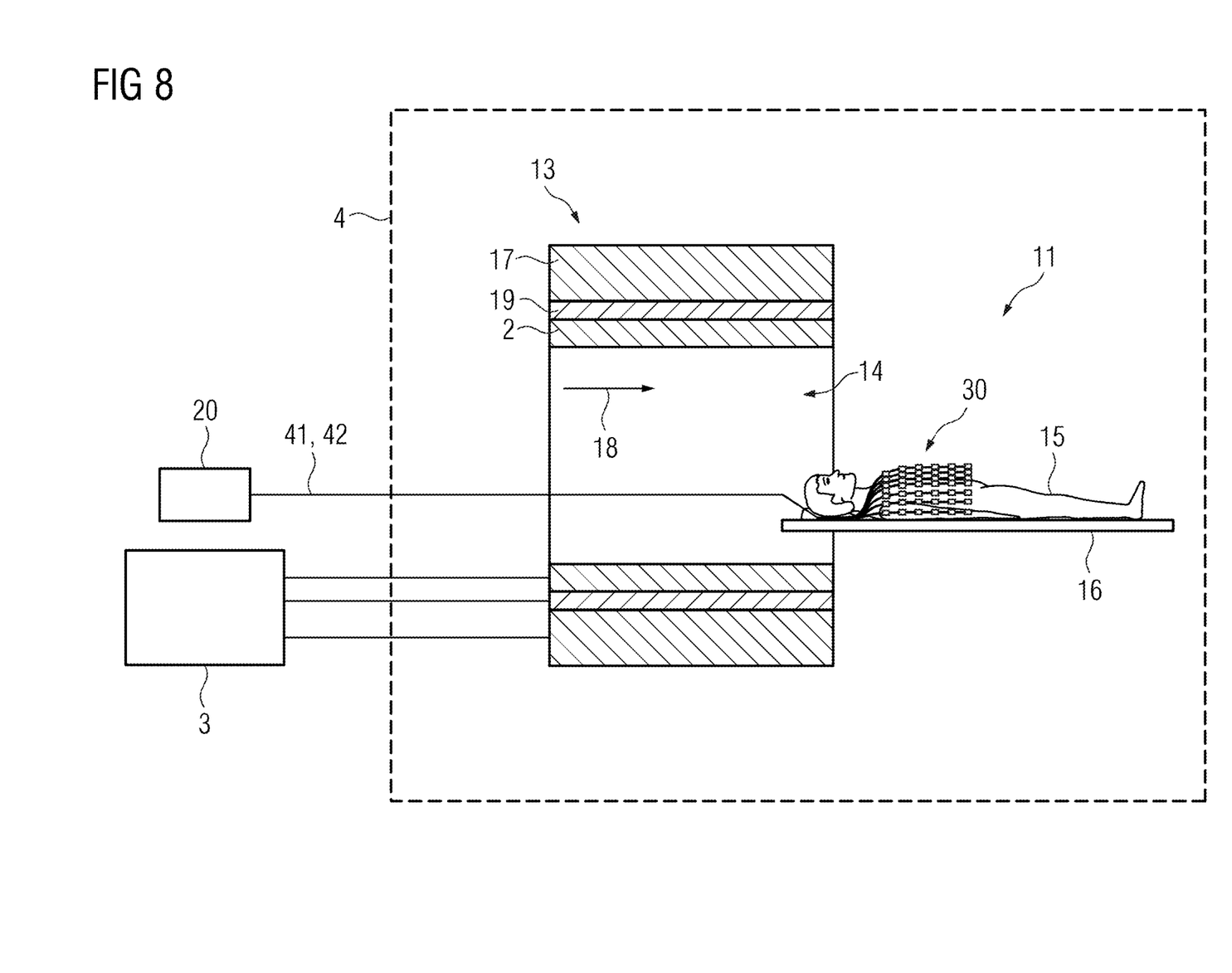
FIG. 8 illustrates a schematic representation of an embodiment of a magnetic resonance system according to the disclosure.

FIG. 8 shows a magnetic resonance system according to the disclosure, comprising a magnetic resonance device 11 arranged in an HF-screened room 4 (e.g. an RF-screened room), a control unit 3 arranged outside the HF-screened room 4, and a receiving unit according to the disclosure.

The magnetic resonance device 11 comprises a detector unit (also referred to herein as a detector or detector circuitry) comprising a magnet unit 13 (also referred to herein as a magnet assembly) with a main magnet 17 for generating a strong and, in particular, constant main magnet field 18. Furthermore, the magnetic resonance device 11 has a cylindrical patient receiving region 14 for receiving a patient 15, the patient receiving region 14 being cylindrically enclosed in a circumferential direction by the magnet unit 13. The patient 15 can be pushed into the patient receiving region 14 by means of a patient positioning apparatus 16 (also referred to herein as a patient positing device or circuitry) of the magnetic resonance device 11. For this purpose, the patient positioning apparatus 16 has a patient table which is arranged movable within the magnetic resonance device 11.

The magnet unit 13 also has a gradient coil unit 19 (also referred to herein as a gradient coil system or gradient coil circuitry) which is used for a position encoding during an imaging process. Furthermore, the magnet unit 13 has a high frequency antenna unit 2 (also referred to herein as antenna circuitry, HF antennas, RF antennas, HF antenna circuitry, or RF antenna circuitry, or simply as one or more antennas) which, in the case shown, is configured as a body coil firmly integrated into the magnetic resonance device 11. On activation, the high frequency antenna unit 2 emits high frequency pulses into an examination space which is formed substantially by the patient receiving region 14. For a control of the main magnet 17, the gradient coil unit 19 and of the high frequency antenna unit 2, the magnetic resonance device has a control unit 3 (also referred to herein as a control computer, controller, or control circuitry) that is separate from the magnetic resonance device 11. The control unit 3 centrally controls the magnetic resonance device 11, for example, the execution of MR control sequences and can have a display unit and/or input unit (not shown in detail). The magnetic resonance device 11 is arranged in an HF-screened room 4, the control unit 3 being arranged outside thereof. The magnetic resonance device 11 disclosed can naturally comprise further components that magnetic resonance devices 11 typically have. A general functional principle of a magnetic resonance device 11 is also known to a person skilled in the art, so that a detailed description of the further components is not included.

The magnetic resonance system comprises the receiving unit according to the disclosure, the sensor unit 30 being arranged within the HF-screened room 4, and the detector unit 20 being arranged outside the HF-screened room 4. The detector unit 20 can be integrated into the control unit 3. The detector unit 20 can be connected to the control unit 3. The detector unit 20 can be configured as separate from the control unit 3. The static main magnet field 18 generated by the main magnet 17 of the magnetic resonance device 11 may have a strength of not more than 0.05 tesla.

Several components described herein are referred to as a "unit." Each one of these respective components may be implemented with any suitable number and/or type of appropriate processors, processing circuitry, hardware circuitry, and/or operate in accordance with any suitable type of executable instructions and/or software to accomplish each respective task as described herein.

Although the disclosure has been illustrated and described in detail based upon the preferred exemplary embodiments, the disclosure is not restricted by the examples given and other variations can be derived therefrom by a person skilled in the art without departing from the protective scope of the disclosure.

What is claimed is:

1. A receiver configured to acquire magnetic resonance (MR) signals from an examination object in a MR device, comprising:
    detector circuitry comprising a light source and a first optical detector;
    sensor circuitry comprising a first optical magnetometer;
    a first optical waveguide configured to connect the sensor circuitry to the light source; and
    a second optical waveguide configured to connect the sensor circuitry to the first optical detector,
    wherein the first optical magnetometer comprises spins and is configured to align the spins in the presence of initial light generated by the light source, and to generate a modified light that is indicative of an MR signal occurring in a sensitivity range about a first position of the first optical magnetometer,
    wherein the first optical detector is configured to acquire the modified light,
    wherein the sensor circuitry comprises at least three further optical magnetometers in addition to the first optical magnetometer to form at least four optical magnetometers, the at least four magnetometers being arranged at four mutually different positions, and
    wherein each of the at least four optical magnetometers comprises spins and is configured to align the spins in the presence of initial light generated by the light source, and to generate a respective further modified light, the further modified light being indicative of an MR signal occurring in a sensitivity range about each respective position of each one of the at least four optical magnetometers.

2. The receiver as claimed in claim 1,
    wherein the detector circuitry is spaced apart from the sensor circuitry by at least 0.3 meters.

3. The receiver as claimed in claim 1, wherein one of the sensor circuitry and the optical magnetometer is free from a macroscopic quantity of metal.

4. The receiver as claimed in claim 1,
    wherein the second optical waveguide comprises at least four second individual optical waveguides, and
    wherein each one of the at least four optical magnetometers is separately connected to the detector circuitry via a respective one of the second individual optical waveguides.

5. The receiver as claimed in claim 1,
    wherein the first optical waveguide comprises at least one optical splitter.

6. The receiver as claimed in claim 1,
    wherein the at least four magnetometers are flexibly connected to one another.

7. The receiver as claimed in claim 1,
    wherein the first optical magnetometer is configured as an atomic vapor cell magnetometer.

8. The receiver as claimed in claim 7,
    wherein the first optical waveguide comprises at least two partial waveguides,
    wherein a first one of the at least two partial waveguides is configured to transfer light to the atomic vapor cell magnetometer for optical pumping, and
    wherein a second one of the at least two partial waveguides is configured to transfer polarized light to the atomic vapor cell magnetometer.

9. The receiver as claimed in claim 1, wherein the first optical magnetometer comprises a crystal having a vacancy center.

10. The receiver as claimed in claim 1, further comprising:
    a frequency filter configured as an interference filter and/or a dichroic mirror, the frequency filter being arranged between the first optical magnetometer and the first optical detector.

11. The receiver as claimed in claim 1, further comprising:
    one or more antennas configured to generate microwaves; and
    a waveguide connected to the one or more antennas and at least partially surrounding the first optical magnetometer.

12. The receiver as claimed in claim 11, wherein the one or more antennas are configured as part of the detector circuitry.

13. The receiver as claimed in claim 11, wherein the waveguide comprises a dielectric waveguide and a dielectric resonator.

14. The receiver as claimed in claim 13, wherein the dielectric waveguide and the dielectric resonator are coupled to one another via a gap.

15. The receiver as claimed in claim 11, wherein the waveguide is arranged at least partially parallel to the first optical waveguide.

16. The receiver as claimed in claim 1, wherein the receiver is configured to acquire the MR signals that are generated by a magnetic resonance device having a main magnet field strength of not more than 0.05 tesla.

17. A magnetic resonance (MR) system, comprising:
a MR device arranged in a radio frequency (RF)-screened room;
control circuitry arranged outside the RF-screened room; and
a receiver configured to acquire MR signals from an examination object in the MR device, the receiver including:
detector circuitry comprising a light source and a first optical detector;
sensor circuitry comprising a first optical magnetometer;
a first optical waveguide configured to connect the sensor circuitry to the light source; and
a second optical waveguide configured to connect the sensor circuitry to the first optical detector,
the first optical magnetometer comprising spins and being configured to align the spins in the presence of initial light generated by the light source, and to generate a modified light that is indicative of an MR signal occurring in a sensitivity range about a first position of the first optical magnetometer, the first optical detector being configured to acquire the modified light,
wherein the sensor circuitry is arranged within the RF-screened room,
wherein the detector circuitry is arranged outside the RF-screened room, and
wherein the first optical waveguide comprises at least one optical splitter.

18. The MR system as claimed in claim 17,
wherein the MR device comprises a main magnet configured to generate a static main magnet field having a main magnet field strength of not more than 0.05 tesla.

19. A receiver configured to acquire magnetic resonance (MR) signals from an examination object in a MR device, comprising:
detector circuitry comprising a light source and a first optical detector;
sensor circuitry comprising a first optical magnetometer;
a first optical waveguide configured to connect the sensor circuitry to the light source; and
a second optical waveguide configured to connect the sensor circuitry to the first optical detector,
wherein the first optical magnetometer comprises spins and is configured to align the spins in the presence of initial light generated by the light source, and to generate a modified light that is indicative of an MR signal occurring in a sensitivity range about a first position of the first optical magnetometer,
wherein the first optical detector is configured to acquire the modified light,
wherein the first optical magnetometer is configured as an atomic vapor cell magnetometer,
wherein the first optical waveguide comprises at least two partial waveguides,
wherein a first one of the at least two partial waveguides is configured to transfer light to the atomic vapor cell magnetometer for optical pumping, and
wherein a second one of the at least two partial waveguides is configured to transfer polarized light to the atomic vapor cell magnetometer.

20. The receiver as claimed in claim 19, further comprising:
a frequency filter configured as an interference filter and/or a dichroic mirror, the frequency filter being arranged between the first optical magnetometer and the first optical detector.

21. The receiver as claimed in claim 19, further comprising:
one or more antennas configured to generate microwaves; and
a waveguide connected to the one or more antennas and at least partially surrounding the first optical magnetometer,
wherein the one or more antennas are configured as part of the detector circuitry,
wherein the waveguide comprises a dielectric waveguide and a dielectric resonator, and
wherein the dielectric waveguide and the dielectric resonator are coupled to one another via a gap.

22. A receiver configured to acquire magnetic resonance (MR) signals from an examination object in a MR device, comprising:
detector circuitry comprising a light source and a first optical detector;
sensor circuitry comprising a first optical magnetometer;
a first optical waveguide configured to connect the sensor circuitry to the light source; and
a second optical waveguide configured to connect the sensor circuitry to the first optical detector,
wherein the first optical magnetometer comprises spins and is configured to align the spins in the presence of initial light generated by the light source, and to generate a modified light that is indicative of an MR signal occurring in a sensitivity range about a first position of the first optical magnetometer,
wherein the first optical detector is configured to acquire the modified light, and
wherein the first optical magnetometer comprises a crystal having a vacancy center.

23. The receiver as claimed in claim 22, further comprising:
a frequency filter configured as an interference filter and/or a dichroic mirror, the frequency filter being arranged between the first optical magnetometer and the first optical detector.

24. The receiver as claimed in claim 22, further comprising:
one or more antennas configured to generate microwaves; and
a waveguide connected to the one or more antennas and at least partially surrounding the first optical magnetometer,
wherein the one or more antennas are configured as part of the detector circuitry,
wherein the waveguide comprises a dielectric waveguide and a dielectric resonator, and
wherein the dielectric waveguide and the dielectric resonator are coupled to one another via a gap.

* * * * *